(12) United States Patent
Luo et al.

(10) Patent No.: US 11,483,002 B2
(45) Date of Patent: Oct. 25, 2022

(54) SYSTEM AND METHODS FOR ELECTRIC DISCHARGE MACHINING

(71) Applicant: General Electric Company, Schenectady, NY (US)

(72) Inventors: Yuanfeng Luo, Rexford, NY (US); Yuefeng Luo, Liberty Township, OH (US); Dale Robert Lombardo, Clifton Park, NY (US); Steven Robert Hayashi, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1196 days.

(21) Appl. No.: 15/440,088

(22) Filed: Feb. 23, 2017

(65) Prior Publication Data

US 2018/0236579 A1    Aug. 23, 2018

(51) Int. Cl.
  *H03K 19/0944*    (2006.01)
  *B23H 1/02*       (2006.01)

(52) U.S. Cl.
  CPC ......... *H03K 19/0944* (2013.01); *B23H 1/028* (2013.01)

(58) Field of Classification Search
  CPC .. H03K 19/0944; H03K 17/6871; B23H 1/02; B23H 1/028
  USPC ............ 219/69.13, 69.18, 69.15, 69.2, 69.11
  See application file for complete search history.

(56) References Cited

U.S. PATENT DOCUMENTS

| | | | |
|---|---|---|---|
| 3,472,994 A | 10/1969 | Sennowitz | |
| 3,927,293 A * | 12/1975 | Bell, Jr. | B23H 1/028 |
| | | | 219/69.13 |
| 4,450,337 A | 5/1984 | Inoue | |
| 5,089,681 A | 2/1992 | El-Menshawy | |

(Continued)

FOREIGN PATENT DOCUMENTS

| CN | 103418864 B | 1/2016 |
|---|---|---|
| GB | 2220162 A | 1/1990 |

OTHER PUBLICATIONS

Han et al., "Development of parallel spark electrical discharge machining", Precision Engineering, vol. 28, Issue: 1, pp. 65-72, Jan. 2004.

(Continued)

*Primary Examiner* — Dana Ross
*Assistant Examiner* — Joe E Mills, Jr.
(74) *Attorney, Agent, or Firm* — Fitch, Even, Tabin & Flannery LLP

(57) ABSTRACT

A multi-loop controller component for an electric discharge machining (EDM) system includes a plurality of power loop circuits coupled to an output of a power supply of the EDM system and configured to receive DC electric power from the power supply. Each power loop circuits electrically-isolated from other power loop circuits. The multi-loop controller component also includes a plurality of transistors. Each transistor is coupled to a respective power loop circuit and is configured to switch between an ON state and an OFF state to generate a pulse of the DC electric power through the respective power loop circuit. In addition, the multi-loop controller component has a drive controller coupled to the plurality of transistors. The drive controller is configured to transmit at least one control signal to at least one of the transistors to facilitate switching the transistor between the ON state and the OFF state.

20 Claims, 4 Drawing Sheets

(56) References Cited

U.S. PATENT DOCUMENTS

| | | | |
|---|---|---|---|
| 5,189,589 A * | 2/1993 | Marschall | H02H 3/044 |
| | | | 327/579 |
| 5,932,116 A * | 8/1999 | Matsumoto | C01B 13/115 |
| | | | 219/121.36 |
| 6,252,191 B1 | 6/2001 | D'Amario | |
| 6,369,343 B1 | 4/2002 | Krenz | |
| 6,373,018 B1 | 4/2002 | Wei et al. | |
| 8,525,064 B2 | 9/2013 | Itoh et al. | |
| 8,963,041 B2 | 2/2015 | Luo | |
| 9,438,101 B1 * | 9/2016 | Flynn | H02M 1/32 |
| 9,452,483 B2 | 9/2016 | Luo et al. | |
| 9,595,958 B1 * | 3/2017 | Nakano | H01L 27/0727 |
| 10,933,480 B2 | 3/2021 | Luo | |
| 2007/0023399 A1 | 2/2007 | Buhler | |
| 2008/0063566 A1 | 3/2008 | Matsumoto | |
| 2010/0243612 A1 | 9/2010 | Leao et al. | |
| 2012/0211357 A1 | 8/2012 | Trimmer | |
| 2012/0217225 A1 * | 8/2012 | Rudgley | B23H 1/02 |
| | | | 219/69.16 |
| 2018/0229319 A1 | 8/2018 | Luo | |

OTHER PUBLICATIONS

Kim et al., "Fabrication of multiple electrodes by reverse EDM and their application in micro ECM", Journal of Micromechanics and Microengineering, vol. 16, No. 4, Mar. 20, 2006.

Uhlmann, E., et al., "Investigations on vibration-assisted EDM-machining of seal slots in high-temperature resistant materials for turbine components", SciVerse ScienceDirect, Procedia CIRP6, pp. 71-76, 2013, 6 pp.

* cited by examiner

SYSTEM AND METHODS FOR ELECTRIC DISCHARGE MACHINING

BACKGROUND

The present disclosure relates generally to electric discharge machining (EDM) and, more particularly, to a multi-loop controller component for EDM systems and methods of machining therewith.

EDM machining is typically used to fabricate a variety of difficult structures in difficult to machine materials. In at least some known EDM machining operations, a workpiece is placed into a tank of fluid, such as hydrocarbon-based oil. An electrode having, for example, a mirror image of the desired component or a cavity shape of the desired cavity in a component, is moved by a ram in proximity to the workpiece. An electric pulse is then applied to the gap between the electrode and the workpiece to generate electric discharges that facilitate removing material from the workpiece. However, at least some known EDM machining systems have low material removal rates due, in part, to a limitation that only one pulse can be generated at a time. As a result, even though multiple electrodes may be used in some EDM systems, they have little to no possibility to discharge at the same time because they share the same control signal and the electrode connections are not electrically isolated from each other. As such, only one electrode of the multiple electrode tool can discharge to remove material during a given pulse. In addition, after the initial discharge period, there is a period during which no discharging takes place before beginning the process again. This leads to a slow machining process speed.

BRIEF DESCRIPTION

In one aspect, a multi-loop controller component for an electric discharge machining (EDM) system is provided. The multi-loop controller component includes a plurality of power loop circuits coupled to an output of a power supply of the EDM system. Each power loop circuit of the plurality of power loop circuits is electrically-isolated from other power loop circuits. The multi-loop controller component is configured to receive DC electric power from the power supply. The multi-loop controller component also includes a plurality of transistors. A respective transistor of the plurality of transistors is coupled to a respective power loop circuit of the plurality of power loop circuits. Each of the respective transistors is configured to switch between an ON state and an OFF state to generate a pulse of the DC electric power through the respective power loop circuit. In addition, the multi-loop controller component includes a drive controller coupled to the plurality of transistors. The drive controller is configured to transmit at least one control signal to at least one of the respective transistors to facilitate the at least one respective transistor to switch between the ON state and the OFF state.

In another aspect, an electric discharge machining (EDM) system is provided. The EDM system includes an electrode array including a plurality of electrodes. Each electrode of the plurality of electrodes is electrically-isolated from other electrodes of the plurality of electrodes. The EDM system also includes a power supply configured to output DC electric power. Moreover, the EDM system includes a multi-loop controller component coupled to the power supply. The multi-loop controller component is configured to receive the DC electric power and to generate a pulse of the DC electric power to each electrode to facilitate an electric discharge between a workpiece and each electrode to remove material from the workpiece. The multi-loop controller component includes a plurality of power loop circuits coupled to an output of the power supply. Each power loop circuit of the plurality of power loop circuits is electrically-isolated from other power loop circuits, and each power loop circuit is coupled to at least one electrode of the plurality of electrodes. The multi-loop controller component also includes a drive controller coupled to the plurality of power loop circuits. The drive controller is configured to transmit at least one control signal to at least one power loop circuit of the plurality of power loop circuits.

In yet another aspect, a method for machining a workpiece using an EDM system is provided. The method includes coupling a multi-loop controller component to a power supply of the EDM system. The multi-loop controller component includes a plurality of power loop circuits and is configured for generating discrete DC electric power pulses to each power loop circuit of the plurality of power loop circuits. Each power loop circuit of the plurality of power loop circuits is electrically-isolated from other power loop circuits. The method also includes coupling an electrode array to the EDM system. The electrode array includes a plurality of electrodes. Each electrode of the plurality of electrodes is electrically-isolated from other electrodes of the plurality of electrodes and is coupled to at least one power loop circuit of the plurality of power loop circuit. The method further includes placing the workpiece in an EDM system for machining, and positioning the workpiece a predetermined distance from the electrode array for the EDM system to perform machining operations on the workpiece. Moreover, the method includes activating the power supply to generate one or more electric discharges between the workpiece and the electrode array for material removal from the workpiece. In addition, the method includes adjusting a position of the workpiece relative to the electrode array until a predetermined shape of the workpiece is achieved.

DRAWINGS

These and other features, aspects, and advantages of the present disclosure will become better understood when the following detailed description is read with reference to the accompanying drawings in which like characters represent like parts throughout the drawings, wherein.

Figure 1:
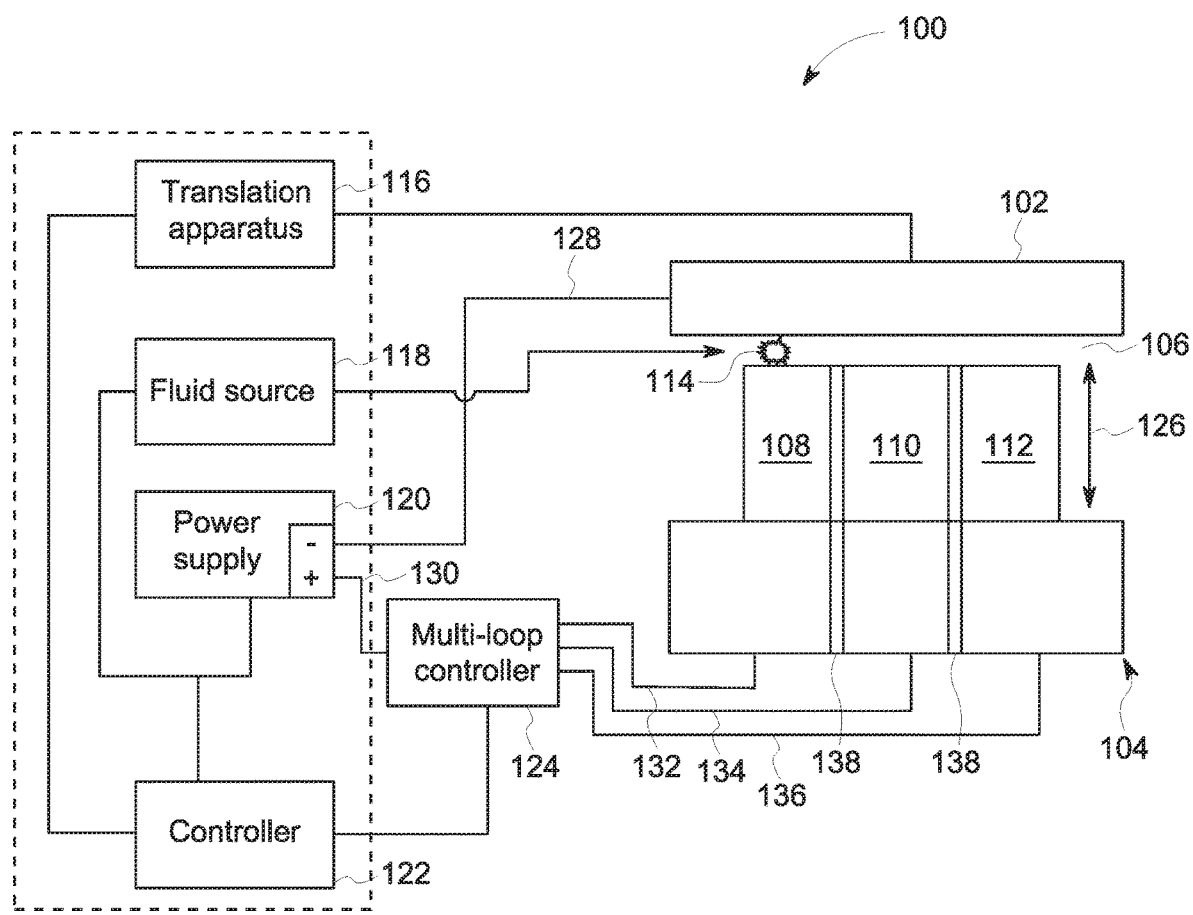
FIG. 1 is a schematic view of an exemplary embodiment of an electric discharge machining (EDM) system for machining a workpiece.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations are combined and interchanged; such ranges are identified and include all the sub-ranges contained therein unless context or language indicates otherwise.

In the following description and claims, the term "coupled" along with its derivatives, may be used. It should be understood that the term "coupled" is used to indicate that two or more elements, which may or may not be in direct physical or electrical contact with each other, cooperate or interact with each other.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Embodiments of the present disclosure provide systems and methods to facilitate increased productivity for electrical discharge machining (EDM) ceramic matrix composite (CMC) materials and other difficult to machine materials. In particular, the systems and methods described herein facilitate generating discrete, multiple electric discharges using a traditional EDM power supply when using electrode arrays. A multi-loop controller component is coupled to a power supply of the EDM system and includes plurality of discrete power loop circuits. An electrode array uses multiple electrodes, where each electrode is controlled individually by a power loop circuit of the multi-loop controller component to facilitate increasing the speed of manufacturing, and increasing the discharge efficiency of EDM machining.

FIG. 1 is a schematic view of an exemplary embodiment of an electric discharge machining (EDM) system 100 for machining a workpiece 102. In the exemplary embodiment, workpiece 102 is positioned proximate an electrode array 104, forming a gap 106 between workpiece 102 and electrode array 104. Electrode array 104 includes one or more electrodes, for example, and without limitation, electrodes 108, 110, and 112, configured to remove material from workpiece 102. In particular, EDM system 100 is configured for electromachining workpiece 102 by applying one or more electric discharges 114 to workpiece 102 by electrodes 108, 110, and 112. Each electrode 108, 110, and 112 is electrically insulated from an adjacent electrode by an insulator component 138, for example, and without limitation, a polymer layer. Alternatively, electrode array 104 does not include insulator components 138 between electrodes 108, 110, and 112. While electrode array 104 is shown having three electrodes 108, 110, and 112, it is noted that electrode array 104 has any number of electrodes that enables EDM system 100 to function as described herein.

In the exemplary embodiment, workpiece 102 and electrode array 104 are fabricated from an electrically conductive material. For example, workpiece 102 is fabricated from materials that are difficult to machine using conventional machining techniques, such as, and without limitation, heat resistant, nickel-based alloys like Inconel, ceramic matrix composites, various superalloys, and the like. Alternatively, workpiece 102 is fabricated from any conductive material that enables EDM system 100 to function as described herein. Electrode array 104 is fabricated from a conductive material that includes, for example, and without limitation, graphite, metals such as brass/zinc, tellurium copper, copper tungsten, silver tungsten, tungsten, and combinations thereof. In alternative embodiments, electrode array 104 is formed from any conductive material that enables EDM system 100 to function as described herein.

Furthermore, EDM system 100 also includes a translation apparatus 116, a fluid source 118, a power supply 120, a controller 122, and a multi-loop controller component 124. Moreover, in some embodiments, EDM system 100 includes any additional component that enables EDM system 100 to function as described herein. In the exemplary embodiment, translation apparatus 116 is coupled to and configured to move electrode array 104 relative to workpiece 102. For example, and without limitation, in one embodiment, translation apparatus 116 moves electrode array 104 longitudinally along path 126. In the exemplary embodiment, path 126 extends substantially along an edge of electrode array 104 to perform a plunge-style machining technique of workpiece 102. In alternative embodiments, EDM system 100 includes any translation apparatus 116 that enables EDM system 100 to function as described herein.

In the exemplary embodiment, fluid source 118 is coupled to EDM system 100 and is configured to provide dielectric fluid to gap 106 during operation of EDM system 100. In particular, fluid source 118 includes a liquid such as, without limitation, water, de-ionized water, oil, hydrocarbon-based oil, a liquid containing an electrolyte, and/or other dielectric liquids. Fluid source 118 is configured to circulate the dielectric fluid through gap 106 defined between electrode array 104 and workpiece 102. In alternative embodiments, EDM system 100 includes any fluid source 118 that enables EDM system 100 to function as described herein. In the exemplary embodiment, the dielectric fluid supplied by fluid source 118 is used to, among other things, maintain media insulation before each electric discharge, capture material particles removed from workpiece 102, and facilitate dispersing heat.

In the exemplary embodiment, power supply 120 is coupled to electrode array 104 and workpiece 102 and configured to provide electrical current to at least one of electrode array 104 and workpiece 102 to induce at least one electrical arc, such as electric discharge 114, between electrode array 104 and workpiece 102. As used herein, the terms "electrical arc" and "arcing" refer to a localized release of electrical energy. In the exemplary embodiment, power supply 120 is a direct current (DC) power supply configured to convert alternating current (AC) electric power into DC electric power. In one embodiment, a voltage of the AC electric power received by power supply 120 has three phases and is rated at approximately 220 Volts AC (VAC). Alternatively, power supply 120 receives AC electric power from any type of source having various characteristics, for example, and without limitation, single phase AC electric power at approximately 120 VAC. In the exemplary embodiment, power supply 120 includes an AC-to-DC component (not shown) configured to convert the received AC electric power into DC electric power. The AC-to-DC component includes, for example, and without limitation, a transformer (not shown) and a rectifier (not shown).

In the exemplary embodiment, a positive output of power supply 120 is coupled to workpiece 102 by a lead 128, such that the workpiece 102 has a positive charge, i.e., forms an anode. A negative output of power supply 120 is coupled to electrode array 104 through multi-loop controller component 124, such that electrode array 104 has a negative charge, i.e., forms a cathode. In particular, the negative output of power supply 120 is coupled to multi-loop controller component 124 by a lead 130, and multi-loop controller component 124 is coupled to electrode array 104 by one or more leads 132, 134, and 136. In alternate embodiments, the polarity is reversed with an anode electrode array 104 and a cathode workpiece 102.

In the exemplary embodiment, electrodes 108, 110, and 112 are each coupled individually to multi-loop controller component 124 through discrete leads 132, 134, and 136, respectively. Leads 132, 134, and 136 are also referred to as power loop circuits. In alternative embodiments, one or more of electrodes 108, 110, and 112 is coupled to any power loop circuit of power supply 120. For example, and without limitation, in one alternative embodiment, electrodes 108 and 112 are each coupled to power loop circuit 132, and electrode 110 is coupled to power loop circuit 134. In the exemplary embodiment, power supply 120 generates an electric discharge, for example electric discharge 114, between each electrode 108, 110, and 112 independently of other electrodes 108, 110, and 112 using power loop circuits 132, 134, and 136 to facilitate removing material from workpiece 102.

In the exemplary embodiment, controller 122 is coupled in communication to the components of EDM system 100 to control the machining of workpiece 102. For example, controller 122 is coupled in communication with and regulates the movement of electrode array 104 by translation apparatus 116. In addition, controller 122 is coupled in communication with and regulates power supply 120 and multi-loop controller component 124 to control electrical arcing between electrode array 104 and workpiece 102. In some embodiments, controller 122 includes a computer numerical controlled (CNC) drive configured to regulate operation of translation apparatus 116. In alternative embodiments, system 100 includes any type of controller 122 that enables system 100 to function as described herein.

Figure 2:
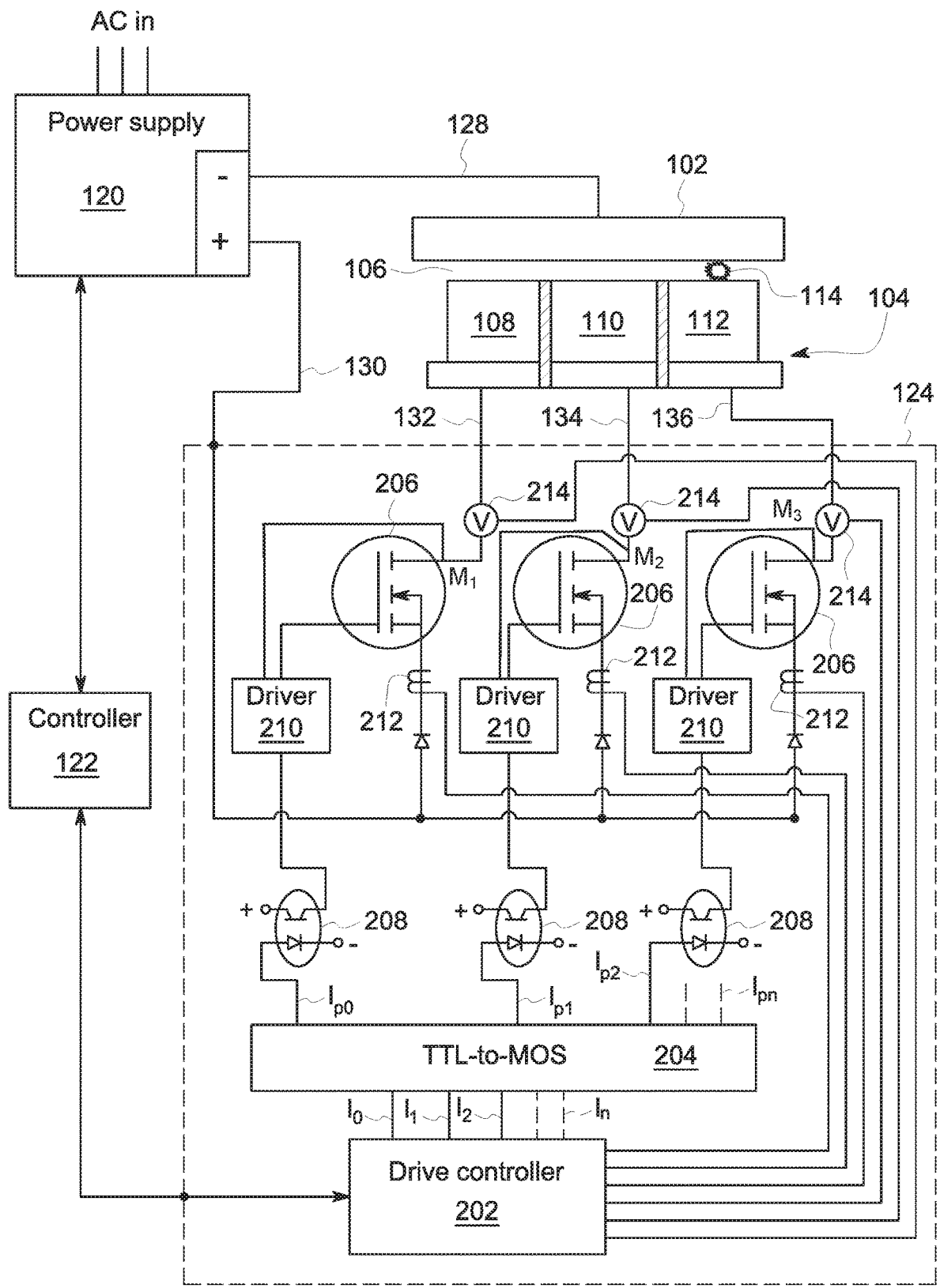
FIG. 2 is a schematic diagram illustrating details of a multi-loop controller component for use in the EDM system shown in FIG. 1.

FIG. 2 is a schematic diagram illustrating details of multi-loop controller component 124 of EDM system 100 (shown in FIG. 1). In the exemplary embodiment, multi-loop controller component 124 is a standalone controller coupled to power supply 120 and configured to redistribute the electric power received from power supply 120 to electrode array 104. The redistribution of the electric power facilitates a pulse of DC electric power to individual electrodes 108, 110, and 112 independently of other electrodes 108, 110, and 112 through power loop circuits 132, 134, and 136, respectively.

In the exemplary embodiment, multi-loop controller component 124 includes a drive controller 202 operatively coupled to a transistor-transistor logic (TTL) to metal-oxide-silicon (MOS) driver 204 (TTL-to-MOS driver). Drive controller 202 contains a processor and memory (neither shown) and is configured to transmit one or more TTL logic signals (broadly control signals), such as signals $I_0, I_1, I_1, \ldots, I_n$ to TTL-to-MOS driver 204. Drive controller 202 is a computing device that is configured to transmit, for example, signals $I_0, I_1, I_1, \ldots, I_n$ to TTL-to-MOS driver 204 to facilitate controlling a pulse interval and pulse duration of DC electric power supplied to 108, 110, and 112 by power loop circuits 132, 134, and 136, respectively. TTL-to-MOS driver 204 is configured to receive TTL signals $I_0, I_1, I_1, \ldots, I_n$ and transmit MOS signals $I_{p0}, I_{p1}, I_{p2}, \ldots, I_{pn}$ having increased current and increased voltage output levels, compared to TTL signals $I_0, I_1, I_1, \ldots, I_n$, suitable for driving MOS circuits.

TTL-to-MOS driver 204 is operatively coupled to a plurality of transistors 206 to control the switching between an "ON state" and an "OFF state" of transistors 206. In the exemplary embodiment, only three transistors 206 are shown, for example a first transistor $M_1$, a second transistor $M_2$, and a third transistor $M_3$, however, it is contemplated that any number of transistors 206 is coupled to TTL-to-MOS driver 204 that enables EDM system 100 to function as described herein. For example, and without limitation, each of first transistor $M_1$, second transistor $M_2$, and third transistor $M_3$ is operatively coupled to TTL-to-MOS driver 204 and configured to receive one of MOS signals $I_{p0}, I_{p1}, I_{p2}, \ldots, I_{pn}$. In the exemplary embodiment, first transistor $M_1$, second transistor $M_2$, and third transistor $M_3$ are coupled in parallel and are configured to quickly switch between the ON state and OFF state to generate the pulse of DC electric power supplied to electrodes 108, 110, and 112 through respective power loop circuits 132, 134, and 136. In one embodiment, the plurality of transistors 206 are a metal-oxide-silicon field-effect type transistor (i.e., a MOSFET). Alternatively, the plurality of transistors 206 is any type of transistor that enables power supply 112 to function as described herein, for example, and without limitation, an insulated-gate bipolar transistor (IGBT).

In the exemplary embodiment, multi-loop controller component 124 also includes a plurality of optoisolators 208. Each optoisolator 208 is coupled between TTL-to-MOS driver 204 and a respective, corresponding transistor 206. Optoisolators 208 are configured to electrically isolate transistors 206 from drive controller 202. Multi-loop controller component 124 also includes a plurality of driver components 210, where each driver component 210 is coupled between a respective optoisolator 208 and its corresponding transistor 206. Driver components 210 are configured to transmit a current necessary to trigger a change in the operating state of transistors 206.

Multi-loop controller component 124 also includes a plurality of current sensors 212 operatively coupled to transistors 206 and drive controller 202 for sensing an amount of current flowing through each respective transistor 206. In one embodiment, if an amount of current flowing through a respective transistor 206 exceeds a predetermined threshold value, drive controller 202 switches transistor 206 to the OFF state. In some embodiments, the predetermined threshold value corresponds to a physical limitation of transistor 206. Alternatively, the predetermined threshold value is any value that enables power supply 120 to function as described herein.

Optionally, or in addition, in one embodiment, multi-loop controller component 124 includes a plurality of voltage sensors 214 operatively coupled to transistors 206 and drive controller 202 for sensing an amount of gap voltage in gap 106 defined between the electrodes and the workpiece, for example, and without limitation, between electrode 108 and workpiece 102, between electrode 110 and workpiece 102, and between electrode 112 and workpiece 102. In one embodiment, the feedback of the measured gap voltage is used by drive controller 202 to detect the discharge status of each of electrodes 108, 110, and 112, for example, to determine when to start the pulse of DC electric power supplied to electrodes 108, 110, and 112, particularly if electrodes 108, 110, and 112 are pulsed out of phase. In addition, in some embodiment, the feedback of the measured gap voltage is used by drive controller 202 to adjust the pulse duration and/or interval, as well as switch transistors 206 between the ON state and the OFF state, and/or used by controller 122 to adjust a relative position of electrode array 104 with respect to workpiece 102.

Figure 3:
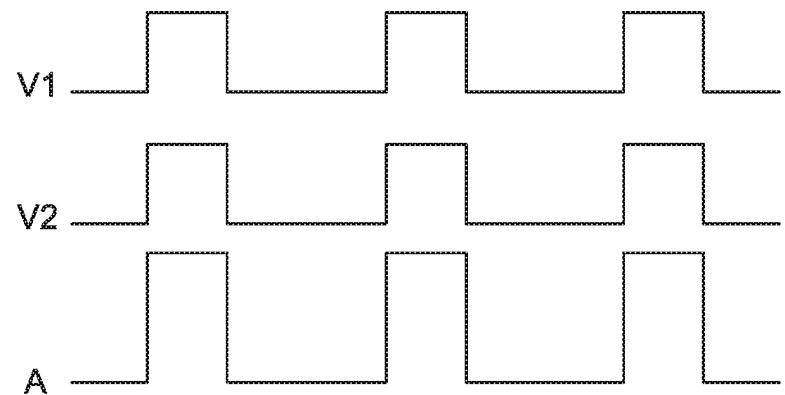
FIG. 3 is a waveform control strategy that can be used with the multi-loop controller component shown in FIG. 2.

FIG. 3 is a waveform control strategy 300 that can be used with multi-loop controller component 124 (shown in FIG. 2). In the exemplary embodiment, and with reference to FIGS. 2 and 3, waveform control strategy 300 is an in phase, simultaneous discharge control strategy and includes a first waveform 302 that corresponds to the DC electric power supplied to at least one electrode of electrode array 104, for example, electrode 108, and a second waveform 304 that corresponds to the DC electric power supplied to at least one other electrode, for example, electrode 110, such that first and second waveforms 302 and 304 are substantially in phase. In particular, multi-loop controller component 124 generates a substantially simultaneous and substantially similar discharge duration, discharge current, and pulse interval to each electrode, such as electrodes 108 and 110, as indicated by waveforms 302 and 304, respectively.

For example, in the exemplary embodiment, multi-loop controller component 124 generates a voltage pulse at the same voltage amplitude through each power loop circuit, such as power loop circuits 132 and 134. As such, multi-loop controller component 124 facilitates providing each of electrodes 108 and 110, for example, with a substantially similar discharge duration and current, which generates a respective electric discharge 114 of substantially the same strength and duration between each of electrode 108 and workpiece 102, and electrode 110 and workpiece 102. This facilitates improved material removal rates of workpiece 102. In addition, waveform control strategy 300 facilitates improved efficiency of power supply 120 by supplying an increased amount of electric power from power supply 120 to workpiece 102, as is indicated by a current waveform 306. Current waveform 306 shows the average current received by workpiece 102 under waveform control strategy 300. Because each of electrodes 108 and 110, for example, discharge in phase and have a substantially similar discharge duration, discharge current, and pulse interval, the total current received by workpiece 102 is increased as compared to discharge of an individual electrode.

Figure 4:
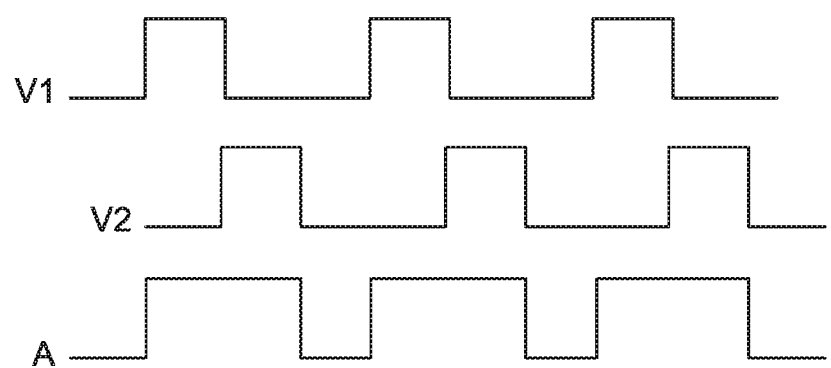
FIG. 4 is an alternative waveform control strategy that can be used with the multi-loop controller component shown in FIG. 2.

FIG. 4 is an alternative waveform control strategy 400 that can also be used with multi-loop controller component 124 (shown in FIG. 2). In the exemplary embodiment, and with reference to FIGS. 2 and 4, waveform control strategy 400 is an out of phase, sequential discharge control strategy and includes a first waveform 402 that corresponds to the DC electric power supplied to at least one electrode of electrode array 104, for example, electrode 108, and a second waveform 404 that corresponds to the DC electric power supplied to at least one other electrode, for example, electrode 110, such that first and second waveforms 402 and 404 are substantially out of phase. In particular, multi-loop controller component 124 generates a pulse interval at different time instances for each of electrodes 108 and 110.

In such an embodiment, multi-loop controller component 124 facilitates providing substantially the same discharge energy to each electrode 108 and 110, and in particular, substantially the same discharge duration and current. That is, electric discharges 114 last for substantially the same duration, but start and stop at different times. The discrete power loop circuits, for example, power loop circuits 132 and 134 of multi-loop controller component 124 facilitates the uniform but unsynchronized electric discharges 114 between electrode 108 and workpiece 102, and electrode 110 and workpiece 102. This facilitates improved material removal rates of workpiece 102. A shown by a current waveform 406, workpiece 102 receives an increased duration of current application to facilitate removing material from workpiece 102, as compared to current received from an individual electrode. In addition, waveform control strategy 400 facilitates part fabrication by providing increased time for the dielectric fluid to relax and for flushing of material debris from workpiece 102 due to the staggered start/stop instances of waveforms 402 and 404. That is, the substantially sequential/staggered start/stop instances of waveforms 402 and 404 facilitate an increased pulse interval before subsequent electric discharges 114 are generated by individual electrodes 108 and 110.

Figure 5:
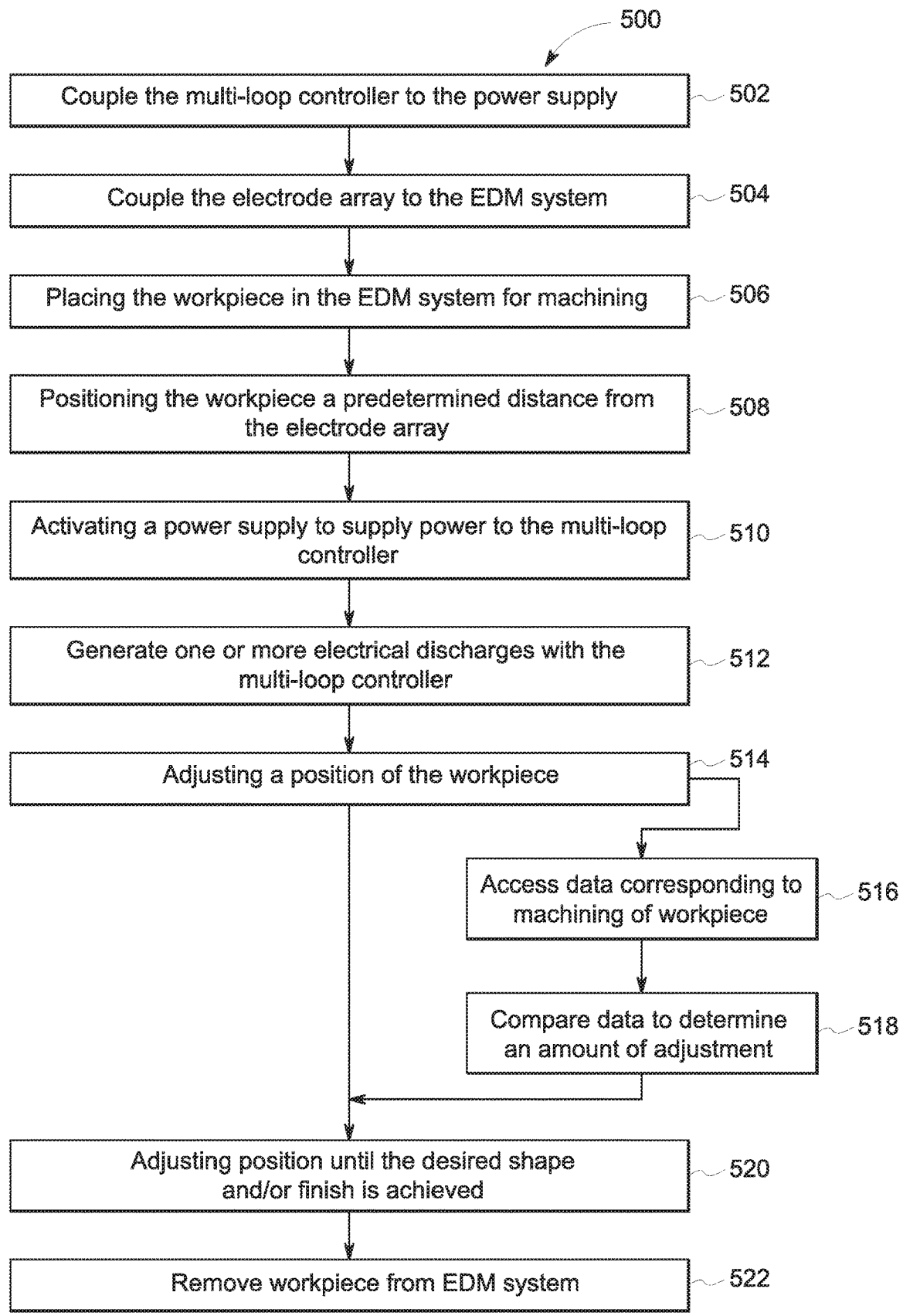
FIG. 5 is a flow diagram of an exemplary method for forming machining the workpiece shown in FIG. 1.

FIG. 5 is a flow diagram of an exemplary method 500 for machining workpiece 102 (shown in FIG. 1). In the exemplary method 500, and with reference to FIGS. 1-5, multi-loop controller component 124 is coupled 502 to power supply 120 of EDM system 100 for generating discrete DC electric power pulses to one or more power loop circuits, such as power loop circuits 132, 134, and 136. In addition, electrode array 104 is coupled 504 to EDM system 100 for machining workpiece 102. In particular, a respective power loop circuit 132, 134, and 136 is coupled to a respective electrode, such as electrode 108, 110, and 112, of electrode array 104. In addition, workpiece 102 is placed 506 in EDM system 100 for machining/processing by electrode array 104. A user and/or controller 122 positions 508 workpiece 102 proximate electrode array 104 at a predetermined distance sufficient for EDM system 100 to perform machining/processing operations on workpiece 102. For example, and without limitation, workpiece 102 is positioned at a predetermined distance with respect to each of electrodes 108, 110, and 112 such that power supply 120 can supply sufficient DC electric power to electrodes 108, 110, and 112 to affect a safe and efficient electric discharge 114 for material removal from workpiece 102. In one embodiment, controller 122 send commands to translation apparatus 116 to adjust the relative position of workpiece 102 and electrode array 104.

After workpiece 102 is sufficiently positioned relative to electrode array 104, controller 122 activates 510 power supply 120 to supply DC electric power to multi-loop controller component 124. Multi-loop controller component 124 generates 512 one or more electric discharges 114 between workpiece 102 and electrode array 104 for material removal. In one embodiment, translation apparatus 116 may move and/or adjust 514 electrode array 104 during machining based on commands received from controller 122. For example, and without limitation, in one embodiment, drive controller 202 and/or controller 122 accesses 516 one or more of a data table, feedback from current sensors 212, feedback from voltage sensors 214, waveform data associated with one or more of TTL logic signals $I_0, I_1, I_2, \ldots, I_n$, etc. Drive controller 202 and/or controller 122 compares 518 data obtained from these sources (e.g., current sensors 212, voltage sensors 214, etc.) to determine an amount of adjustment of workpiece 102 relative to electrode array 104 during machining/processing, and/or the duration, discharge current, and pulse interval for each of electrodes 108, 110, and 112. Workpiece 102 is adjusted 520 relative to electrode array 104 until the desired shape of workpiece 102 is achieved. Workpiece 102 is removed 522 from EDM system 100 once it has attained the desired shape.

The embodiments described herein relate to systems and methods for facilitating discrete, multiple electric discharges using a traditional EDM power supply when using electrode arrays. In particular, a multi-loop controller component is coupled to a power supply of the EDM system and includes plurality of discrete power loop circuits. An electrode array having a plurality of individual, electrically-isolated electrodes is coupled to the multi-loop controller component and is used to machine and/or process the workpiece. The multi-loop controller component is configured to drive each power loop circuit with substantially the same pulse duration, discharge current, and pulse interval to facilitate improved machining speed of the workpiece being machined. In addition, the efficiency of the EDM system is improved by increasing the average amount of electric power supplied to the workpiece from the power supply during machining.

An exemplary technical effect of the systems and methods described herein includes at least one of: (a) reducing the time to machine the workpiece; (b) increasing a material removal rate of the machining operation; (c) providing complete independent control of individual electrodes of the EDM system, without sacrificing the discharge power of the electrodes; and (d) increasing the efficiency of the EDM machining processes.

Exemplary embodiments of methods and systems are not limited to the specific embodiments described herein, but rather, components of systems and steps of the methods may be utilized independently and separately from other components and steps described herein. For example, the methods may also be used to manufacture other components, and are not limited to practice with only the components and methods as described herein. Rather, the exemplary embodiment can be implemented and utilized in connection with many other applications, equipment, and systems that may benefit from the advantages described herein.

Although specific features of various embodiments of the disclosure may be shown in some drawings and not in others, this is for convenience only. In accordance with the principles of the disclosure, any feature of a drawing may be referenced and claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electric discharge machining (EDM) system comprising:
   a multi-loop controller component, said multi-loop controller component comprising:
      a plurality of power loop circuits coupled to an output of a power supply of the EDM system and configured to receive DC electric power from the power supply, a respective power loop circuit of said plurality of power loop circuits electrically-isolated from other power loop circuits of said plurality of power loop circuits;
      at least two transistors, wherein a respective transistor of said at least two transistors is directly electrically coupled to said respective power loop circuit of said plurality of power loop circuits, each said respective transistor configured to switch between an ON state and an OFF state to generate a pulse of the DC electric power through said respective power loop circuit; and a drive controller coupled to said at least two transistors, said drive controller configured to transmit at least one control signal to at least one said respective transistor to facilitate said at least one said respective transistor to switch between the ON state and the OFF state; and an electrode array comprising at least two electrodes configured to deliver an electric charge to a workpiece, wherein the drive controller is coupled to a voltage sensor coupled to and between each of the at least two transistors and a corresponding one of the at least two electrodes and configured to sense a voltage level, and wherein the drive controller is further configured to control the timing and duration of an electrical pulse sent to an electrode based on the voltage level.

2. The EDM system in accordance with claim 1, wherein said transistor is a metal-oxide-silicon field-effect type transistor.

3. The EDM system in accordance with claim 1 further comprising a plurality of current sensors, wherein each said respective power loop circuit comprises a respective current sensor of said plurality of current sensors operatively coupled to said respective transistor and operatively coupled to said drive controller for determining an amount of current flowing through said respective transistor, and wherein said drive controller is configured to switch said respective transistor to the OFF state if an amount of current flowing through said respective transistor exceeds a predetermined threshold value.

4. The EDM system in accordance with claim 1 further comprising a plurality of voltage sensors, wherein each said respective power loop circuit comprises a respective voltage sensor of said plurality of voltage sensors operatively coupled to said respective transistor and operatively coupled to said drive controller for determining an amount of gap voltage in a gap defined between a workpiece and an electrode of the EDM system.

5. The EDM system in accordance with claim 1 further comprising a transistor-transistor logic to metal-oxide-silicon (TTL-to-MOS) driver configured to receive the at least one control signal and transmit at least one MOS signal to said at least one said respective transistor, the at least one MOS signal having an increased current and increased voltage output level relative to the at least one control signal.

6. The EDM system in accordance with claim 5, wherein each said respective power loop circuit comprises an optoisolator configured to electrically isolate each said respective transistor from said drive controller.

7. The EDM system in accordance with claim 6, wherein each said respective power loop circuit further comprises a driver component coupled between said optoisolator and said respective transistor, said driver component comprising a current source, wherein said driver component is configured to transmit a current configured to change said respective transistor between the ON state and the OFF state.

8. The EDM system in accordance with claim 1, wherein said drive controller transmits a first control signal to a first power loop circuit of said plurality of power loop circuits, and said drive controller further transmits a second control signal to a second power loop circuit of said plurality of power loop circuits, wherein said first control signal and said second control signal are in phase and configured to generate simultaneous pulses of the DC electric power through said first power loop circuit and said second power loop circuit.

9. The EDM system in accordance with claim 1, wherein said drive controller transmits a first control signal to a first power loop circuit of said plurality of power loop circuits, and said drive controller further transmits a second control signal to a second power loop circuit of said plurality of power loop circuits, wherein said first control signal and said second control signal are out of phase and configured to generate sequential pulses of the DC electric power through said first power loop circuit and said second power loop circuit.

10. An electric discharge machining (EDM) system comprising:

an electrode array comprising at least two electrodes, each electrode of said at least two electrodes electrically-isolated from other electrodes of said at least two electrodes;

a power supply configured to output DC electric power; and a multi-loop controller component coupled to said power supply, said multi-loop controller component configured to receive the DC electric power and to generate a pulse of the DC electric power to said each electrode to facilitate an electric discharge between a workpiece and said each electrode to remove material from the workpiece, said multi-loop controller component comprising:

at least two transistors coupled to said power supply configured to supply an electric current from the power supply to different ones of the at least two electrodes;

a plurality of power loop circuits coupled to an output of said power supply, each power loop circuit of said plurality of power loop circuits electrically-isolated from other power loop circuits of said plurality of power loop circuits, said each power loop circuit coupled to at least one electrode of said at least two electrodes, wherein said each power loop circuit comprises a transistor directly electrically coupled to said at least one electrode; and a drive controller coupled to said plurality of power loop circuits, said drive controller configured to transmit at least one control signal to at least one power loop circuit of said plurality of power loop circuits;

wherein the drive controller is coupled to a voltage sensor coupled to and between each of the at least two transistors and a corresponding one of the at least two electrodes and configured to sense a voltage level, and wherein the drive controller is further configured to control the timing and duration of an electrical pulse sent to an electrode based on the voltage level.

11. The EDM system in accordance with claim 10, wherein said transistor is configured to switch between an ON state and an OFF state to generate the pulse of the DC electric power through said each power loop circuit.

12. The EDM system in accordance with claim 11, wherein said transistor is a metal-oxide-silicon field-effect type transistor.

13. The EDM system in accordance with claim 11, wherein said multi-loop controller component further comprises a plurality of current sensors, wherein said each power loop circuit comprises a respective current sensor of said plurality of current sensors operatively coupled to said transistor and operatively coupled to said drive controller for determining an amount of current flowing through said transistor, and wherein said drive controller is configured to switch said transistor to the OFF state if an amount of current flowing through said transistor exceeds a predetermined threshold value.

14. The EDM system in accordance with claim 11, wherein said multi-loop controller component further comprises a plurality of voltage sensors, wherein said each power loop circuit comprises a respective voltage sensor of said plurality of voltage sensors operatively coupled to said transistor and operatively coupled to said drive controller for determining an amount of gap voltage in a gap defined between the workpiece and said at least one electrode.

15. The EDM system in accordance with claim 11, wherein said multi-loop controller component further comprises a transistor-transistor logic to metal-oxide-silicon (TTL-to-MOS) driver configured to receive the at least one control signal and transmit at least one MOS signal to said at least one power loop circuit, the at least one MOS signal having an increased current and increased voltage output level relative to the at least one control signal.

16. The EDM system in accordance with claim 15, wherein said at least one power loop circuit further comprises an optoisolator configured to electrically isolate said transistor from said drive controller.

17. The EDM system in accordance with claim 16, wherein said at least one power loop circuit further comprises a driver component coupled between said optoisolator and said transistor, said driver component comprising a current source, wherein said driver component is configured to transmit a current configured to change said transistor between the ON state and the OFF state.

18. An electric discharge machining (EDM) device comprising:
a multi-loop controller component configured to cause an electrical discharge from an electrode array comprising at least two electrodes, the multi-loop controller component comprising:
at least two transistors coupled to a direct current power supply configured to supply an electric current from the direct current power supply to different ones of the at least two electrodes;
a drive controller coupled to and electrically isolated from a driver, each driver configured to control the state of one of the at least two transistors, the drive controller configured to control the timing and duration of an electrical pulse sent to an electrode of the electrode array,
wherein the drive controller is coupled to and electrically isolated from each driver by an optoisolator;
the electrode array comprising at least two electrodes configured to deliver an electric charge to a workpiece, each of the at least two electrodes of the electrode array being electrically isolated from one another by an insulator component,
wherein the electrical isolation of the drive controller from the driver and the insulator components of the electrode array are configured to enable the EDM device to operate with increase discharge speed and efficiency by allowing the drive controller to cause individual ones of the at least two electrodes to discharge.

19. The EDM device of claim 18, wherein the drive controller is coupled to a voltage sensor coupled to and between each of the at least two transistors and a corresponding one of the at least two electrodes and configured to sense a voltage level, and wherein the drive controller is further configured to control the timing and duration of an electrical pulse sent to an electrode based on the voltage level.

20. The EDM device of claim 18, wherein the drive controller is coupled to a current sensor coupled to and between the direct current power supply and each of the at least two transistors and configured to determine an amount of current flowing through individual ones of the at least two transistors, wherein the drive controller is configured to cause any one of the drivers to cause any one of the at least two transistors to prevent the flow of current through a transistor based on the amount of current.

* * * * *

UNITED STATES PATENT AND TRADEMARK OFFICE
CERTIFICATE OF CORRECTION

| | | |
|---|---|---|
| PATENT NO. | : 11,483,002 B2 | Page 1 of 1 |
| APPLICATION NO. | : 15/440088 | |
| DATED | : October 25, 2022 | |
| INVENTOR(S) | : Luo et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1437 days.

Signed and Sealed this
Twenty-eighth Day of January, 2025

Coke Morgan Stewart
*Acting Director of the United States Patent and Trademark Office*